United States Patent [19]

Nakamura et al.

[11] Patent Number: 4,717,942

[45] Date of Patent: Jan. 5, 1988

[54] DYNAMIC RAM WITH CAPACITOR GROOVE SURROUNDING SWITCHING TRANSISTOR

[75] Inventors: Kunio Nakamura; Yukinori Kuroki, both of Tokyo, Japan

[73] Assignee: NEC Corporation, Tokyo, Japan

[21] Appl. No.: 635,538

[22] Filed: Jul. 30, 1984

[30] Foreign Application Priority Data

Jul. 29, 1983 [JP] Japan ............................ 58-139007
Sep. 12, 1983 [JP] Japan ............................ 58-167785

[51] Int. Cl.$^4$ ............................................. H01L 29/78
[52] U.S. Cl. ................................ 357/23.6; 357/23.11; 357/50; 357/55; 357/59; 365/149
[58] Field of Search ............... 357/23.6, 23.11, 55, 357/50, 59; 365/149

[56] References Cited

U.S. PATENT DOCUMENTS

| | | | |
|---|---|---|---|
| 3,901,737 | 8/1975 | Dash ..................................... | 357/55 |
| 3,961,355 | 6/1976 | Abbas et al. ......................... | 357/23.6 |
| 4,345,364 | 8/1982 | McElroy ............................... | 357/23.6 |
| 4,353,086 | 10/1982 | Jaccodine et al. ................... | 357/55 |

FOREIGN PATENT DOCUMENTS 51-130178 11/1976 Japan ............................ 357/23.6
58-3260 1/1983 Japan ............................ 357/23.6

OTHER PUBLICATIONS

G. Clarke et al., "Capacitor for Single Fet Memory Cell," IBM Tech. Discl. Bull., vol. 17, #9, Feb. 1975, pp. 2579-2580.

Sunami et al., "A Corrugated Capacitor Cell (CCC) for Megabit Dynamic MOS Memories", *Technical Digest of the International Electron Devices Meeting* (IEDM), Dec. 13-15, 1982, pp. 806-808.

*Primary Examiner*—Joseph E. Clawson, Jr.
*Attorney, Agent, or Firm*—Burns, Doane, Swecker & Mathis

[57] ABSTRACT

A semiconductor memory cell of a single field effect transistor and a single capacitor is surrounded or delimited at its three sides in the plan view by grooves formed in a semiconductor substrate. The capacitor in each memory cell is formed on one side wall surface or both side wall surfaces of this groove. With such construction, an increase in a capacitance can be achieved and a degree of circuit integration can be enhanced in distinction from the case where a groove is provided within an active region, that is, within a plan region of a capacitor section.

11 Claims, 22 Drawing Figures

|—CAPACITOR—|—IGFET—|

DYNAMIC RAM WITH CAPACITOR GROOVE SURROUNDING SWITCHING TRANSISTOR

BACKGROUND OF THE INVENTION

The present invention relates to a semiconductor memory device making use of insulated gate field effect transistors (hereinafter called "IGFET's"), and more particularly to a structure of a memory capacitor section having a memory function in the semiconductor memory device.

The most widely used memory device employs the so-called "single-transistor type" memory cell which consists of a single IGFET and a capacitor coupled thereto. Memory cells are arranged in this memory in a matrix array and the gate of each IGFET is connected to a word line and one of its source and drain regions is connected to a digit line. The capacitor section is connected to the channel region of this IGFET either directly or via the other of the source and drain regions, and existence or non-existence of electric charge stored in this capacitor section serves as stored information. The capacitor is typically a MOS capacitor and the capacitance $C_s$ of this MOS capacitor is given by the formula of $C_s = \epsilon S/t$, where $\epsilon$ is a dielectric constant of an insulating film, S an electrode area of the capacitor section and t a thickness of the insulating film.

In recent years, in accordance with the progress of high circuit integration in semiconiuctor devices, microfining of circuit elements has been required. Even in micro-fining a memory device of single-transistor type, reduction of the value of the capacitance $C_s$ must be avoided to the utmost for the purpose of facilitating determination of stored information and maintaining a resistance against radioactive rays such as, for example, $\alpha$-rays. Consequently, in the prior art increase of the capacitance $C_s$ was contemplated by thinning the thickness of the insulating film, but this approach also could not always be said to be a satisfactory method because of increase of a pin hole density, lowering of a withstand voltage or the like caused by thinning of the insulating film. On the other hand, in order to increase the area S for the purpose of contemplating increase of the capacitance $C_s$, a method of forming a groove in the semiconductor substrate within a capacitor section area has been also proposed. However, since this method proposed in the prior art contemplated to form a groove always within each memory cell area, a plan area for forming this groove became necessary, and hence a high degree of circuit integration was not expected.

SUMMARY OF THE INVENTION

It is therefore one object of the present invention to provide a semiconductor memory device in which increase in a capacitance can be realized and yet a high degree of circuit integration can be maintained.

According to one feature of the present invention, there is provided a semiconductor memory device comprising a plurality of memory cells arranged in a matrix form, each memory cell including a single IGFET and a single capacitor, each memory cell being surrounded at its three sides by grooves formed in a semiconductor substrate of one conductivity type, and at least a part of the capacitor being formed on one side wall surface of the groove. Namely, a dielectric film and an upper electrode of the capacitor are formed on the side wall surface of the groove surrounding and delimiting the area of memory cell area. Moreover, an impurity layer of the opposite conductivity type may be formed in a portion of the substrate along the side wall surface of the groove, so that the side wall surface of the groove may be used as a part of MOS capacitor and a part of PN junction capacitor of the memory cell. The isolation between adjacent memory cells can be realized by providing an impurity region of the same conductivity type as the substrate and having a higher impurity concentration than the substrate in the portion of the substrate under the bottom surface of the groove. The impurity region has favorably a depth of 0.5 to 1.0 $\mu$m from the bottom of the groove and an impurity concentration of $5 \times 10^{18}/cm^3$ or higher. Also, the insulating film on the bottom surface of the groove has favorably a thickness of 100 Å or larger.

According to another feature of the present invention, there is provided a semiconductor memory device comprising a semiconductor substrate, first and second digit lines extending in one direction along one major surface of the semiconductor substrate, a first groove provided from the one major surface of the semiconductor substrate towards the interior of the semiconductor substrate and extending in the one direction substantially along a midline between the first and second digit lines, a second groove provided from the one major surface of the semiconductor substrate towards the interior of the semiconductor substrate and extending substantially at right angles to the first groove, a third groove provided from the one major surface of the semiconductor substrate towards the interior of the semiconductor substrate and extending substantially in parallel to the second groove, a thick field insulating film selectively provided on the one major surface of the semiconductor substrate and having a plan configuration making contact with the opposite ends of the second and third grooves, a thin insulating film provided on the opposite side wall surfaces and the bottom surfaces of the respective ones of the first, second and third grooves, an impurity region of the same conductivity type as the semiconductor substrate and having a higher impurity concentration than the semiconductor substrate provided in the portion of the semiconductor substrate under the bottom surfaces of the first, second and third grooves, impurity layers of the opposite conductivity type to the semiconductor substrate provided in the surface portions of the opposite inner side walls of at least the first groove, a first memory cell including a plane region of a capacitor substantially surrounded by the first, second and third grooves and a transistor having one of its source and drain regions connected to the first digit line, a second memory cell including a plane region of a capacitor substantially surrounded by the first, second and third grooves and a transistor having one of its source and drain regions connected to the second digit line, a third memory cell including a plane region of a capacity delimited at its two sides by the first and second grooves and a transistor having one of its source and drain regions connected to the first digit line, a fourth memory cell including a plane region of a capacitor delimited at its two sides by the first and second grooves and a transistor having one of its source and drain regions connected to the second digit line, and a conductor layer filled entirely at least in the first groove via the thin insulating film to serve an upper electrode of the capacitor of respective the memory cell. In the above mentioned structure, at least a part of MOS capacitor in the capacitor of the memory cell is constructed of the conductor layer, the thin insulating film and the impurity layer of the opposite conductivity type in the first groove. Also, at least a part of PN junction capacitor in the capacitor of the memory cell is constructed of the impurity layer of the opposite conductivity type and the semiconductor substrate in the first groove. Favorably, the end parts of the second and third grooves in the proximity of their opposite ends making contact with the field insulating film are filled with insulator material, and the other parts of the second and third grooves are filled with the conductor layer. Moreover, the second and third grooves may be entirely filled with an insulator material.

According to further feature of the present invention, there is provided a semiconductor memory device comprising a semiconductor substrate of one conductivity type, an IGFET provided in a transistor forming area of the semiconductor substrate and having one of source and drain regions of the opposite conductivity type connected to a digit line, the other of source and drain regions of the opposite conductivity type, a channel region between the source and drain regions and a gate electrode formed on the channel region via a gate insulating film, a groove formed in the semiconductor substrate and having U shape in the plan view such that it surrounds the transistor forming area, a dielectric film formed on the both inner side wall surfaces facing each other and on the bottom surface of the groove, an impurity region of the one conductivity type having a higher impurity concentration than that of the semiconductor substrate formed in portions of the semiconductor substrate along the inner side wall surfaces and the bottom surface of the groove, and a conductor layer formed on the dielectric film within the groove and connected to the other of source and drain of said transistor, whereby a MOS capacitor of the memory cell connected to the transistor is constructed by the conductor layer, the dielectric film and the impurity region. Moreover, to increase the MOS capacitance, a conductor body may be connected to and erected from the bottom surface and another dielectric film is formed on the surface of the conductor body, and the conductor layer is provided on the another dielectric film.

Further, the conductor layer may be removed on a portion of the bottom surface of the groove. In this case, a part of the conductor layer extending on one of the inner side wall surfaces of the groove via the dielectric film serves as an upper electrode of a capacitor in a first memory cell and a part of the conductor layer extending on the other of the inner side wall surfaces of the groove via the dielectric film serves as an upper electrode of a capacitor in a second memory cell adjacent to the first memory cell.

According to the present invention, it is intended that a groove is formed at a peripheral portion of each memory cell. The groove is used for insulation between capacitor sections of the respective memory cells and side wall portions of the groove are utilized as capacitors, thereby achieving reduction of a dimension between the elements as well as increase of the capacitance. The insulator portion between the capacitor sections of the memory cells is normally covered by a capacitor electrode. If the memory cell is used under the condition that the capacitor electrode is grounded, a leakage current can be prevented from flowing by sufficiently raising the impurity concentration of the substrate at the bottom of the groove.

According to a first aspect of the present invention, in order to allow an inversion layer to be formed under the capacitor electrode, an impurity of the opposite conductivity type to that of the substrate is favorably introduced into the surface portion of the substrate and thereby lower the threshold voltage. According to the present invention, formation of an inversion layer in the side wall of the groove is made possible by diffusing an impurity of the opposite conductivity type to that of the substrate into the side wall of the groove and the inversion layer can contribute to increase of the capacitance. In other words, the use of a MOS capacitor and a PN-junction capacitor is the first aspect of the present invention.

On the other hand, according to a second aspect of the present invention, while the side wall of the memory cell is also positively used as a capacitor, in this case as a sufficient counter-measure against α-rays, only a MOS capacitor is used. In the memory device according to the second aspect of the invention, among the source and drain regions of the IGFET, to the region not connected to a digit line is connected a capacitor upper electrode, and this capacitor upper electrode is extended over the side surface of the groove of the memory cell via a thin capacitor insulating film. On the other hand, in the surface portion of the semiconductor substrate under this capacitor electrode is provided a high concentration impurity region of the same conductivity type as the semiconductor substrate. Since a PN-junction capacitor is not employed in this structure, the semiconductor memory device has a large resistivity against α-rays. In addition, if an insulator is filled in the gap space between the capacitor electrodes above the memory cells through the well-known technique, desired insulation between the memory cells can be realized.

DESCRIPTION OF PREFERRED EMBODIMENTS

Figure 1:
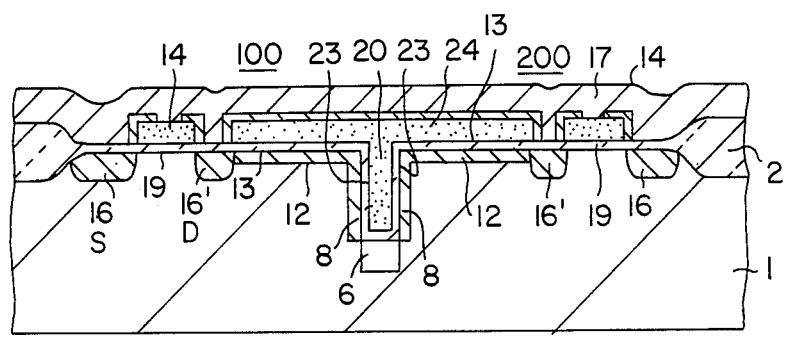
FIG. 1 is a cross-sectional view showing a first preferred embodiment of the present invention.

Referring now to FIG. 1 of the drawings, only two memory cells 100 and 200 of "single-transistor type" are shown, which are provided in an active region adjacent to a thick field silicon oxide film 2 formed on one major surface of a P-type semiconductor substrate 1. In each memory cell, an IGFET having N-type impurity regions 16 and 16' serving as source and drain regions and a silicon gate electrode 14 formed above a channel region between the respective impurity regions via a gate insulating film 19 is provided. The gate electrode 14 is connected to a word line 17. The N-type impurity region 16 is connected to a digit line not shown, but it is possible to omit the other N-type impurity region 16'. In addition, each memory cell includes a capacitor section connected to the IGFET. This capacitor section is formed by making use of a side wall of a groove 20 in the semiconductor substrate 1 which is located between the adjacent memory cells 100 and 200, as well as use of respective plane regions thereof. More particularly, in the capacitor section is formed a capacitor including an N-type inversion region 12 provided in the surface portion of the plane region thereof, an N-type inversion region 8 provided along the side wall surface of the groove 20, dielectric films 13 and 23 made of silicon oxide films provided on these inversion regions 12 and 8, respectively, and an upper electrode 24 made of polycrystalline silicon. In other words, a MOS capacitor consisting of the upper electrode 24, the dielectric films 13 and 23 and the inversion layers 8 and 12, and a PN-junction capacitor between the inversion layers 8 and 12 and the semiconductor substrate 1, are formed. The N-type region 16' provided in the embodiment illustrated in FIG. 1, could be omitted. In this case, it is only necessary to make the gate electrode 14 overlap with the upper electrode 24 of the capacitor via an insulating film. In addition, a high-concentration P-type impurity region 6 is provided under the bottom of the groove 20 formed in the semiconductor substrate and thereby the memory cells 100 and 200 on the left and right side of the groove 20 can be effectively isolated. By way of example, the N-type inversion regions 8 and 12 have an impurity concentration of $10^{18}/cm^3$, the capacitor dielectric films 13 and 23 made of silicon oxide films have a thickness of 150 Å, the depth of the groove 20 is 4 to 5 μm and its width is about 1 μm.

The above-described groove 20 along the side surface of the capacitor section can be provided also along the other two side surfaces. In other words, the capacitor section according to the present invention has its three side surfaces of the grooves, and the side wall surfaces of the grooves are positively utilized as a capacitor. With such construction of the capacitor section, a capacitance value of $C_s \approx 50$ fF that is necessary for a memory cell can be easily obtained without enlarging the plan area of the capacitor section. For instance, in the case where the dielectric films 13 and 23 are made of silicon oxide films of 200 Å in thickness and the plane region of the capacitor section is a square of 5 μm×5 μm, the three sides of the plane region of the capacitor section are surrounded by a groove, and one side wall of the groove is utilized as a capacitor. If the depth of the groove is 2 μm, the capacitance of the memory cell capacitor becomes about 100 fF, and if the depth of the groove is 4 μm, it becomes about 150 fF.

On the other hand, the high-concentration P-type impurity concentration of $10^{19}/cm^3$. If the thickness of the insulating film made of a silicon oxide film at the bottom of the groove is 100 Å or thicker and the impurity concentration of the P-type region 6 is $5\times10^{18}/cm^3$ or higher, then the threshold voltage Vth becomes 5 V or higher, and so, no trouble is brought about in the insulation between the memory cells on the left and right sides of the groove.

Now, a process for manufacturing the semiconductor memory device shown in FIG. 1 will be briefly explained with reference to FIGS. 2 through 12.

Figure 2:
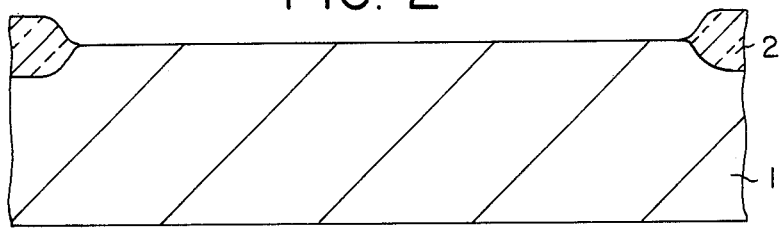
FIGS. 2 through 12 are cross-sectional views showing the successive steps in the process for manufacturing the semiconductor memory cells illustrated in FIG. 1.
Figure 3:
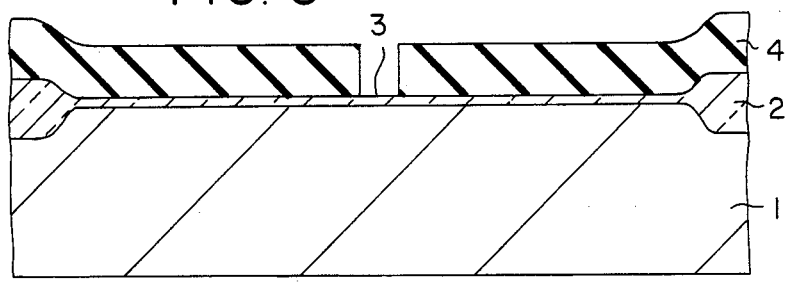
Figure 4:
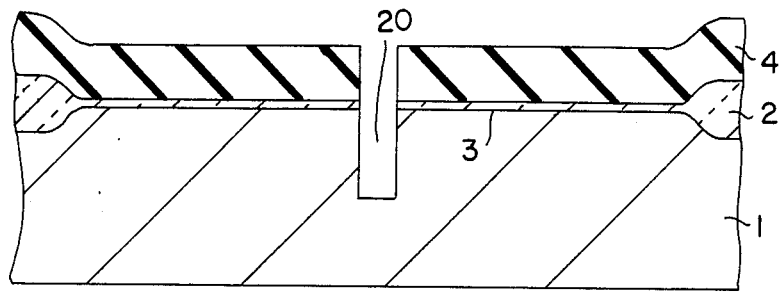

Referring now to FIG. 2, a thick field oxide film 2 is formed on a P-type silicon substrate 1 through the conventional selective oxidation process. Subsequently, after an oxide film 3 has been formed on the substrate 1 as shown in FIG. 3, a photo-resist 4 is coated over the entire surface, and an aperture is formed in the portion of the photo-resist 4 which portion is to become the region between the capacitor sections of the memory cells through the conventional light exposure or the electron beam exposure. As shown in FIG. 4, a groove 20 is formed in the substrate 1 by reactive ion etching. As the gas to be used for etching, it is preferable to use chlorocarbon series gases such as $CCl_4$, $CCl_3F$, $CCl_2F_2$, etc. In the case where the frequency of the high frequency power for inducing plasma is 13.56 MHz, a pressure of about 1 to 10 Pa (pascal) is suitable. An etching speed for a silicon substrate depends upon an electric power, and in the case of an electric power of about 0.1 to 1.0 W/cm², an etching speed of about 500 to 2000 Å/Min. can be obtained. In the case of forming a deep groove, since a selective ratio between the etching speeds for a photo-resist and silicon cannot be realized satisfactorily, it is also possible to form the above-described oxide film as a thick oxide film grown through a vapor-growth process and to use it as a spacer in the etching process. In this case, in the etching for the above-described oxide film it is suitable to employ reactive ion etching of the $CF_4+H_2$ series.

Figure 5:
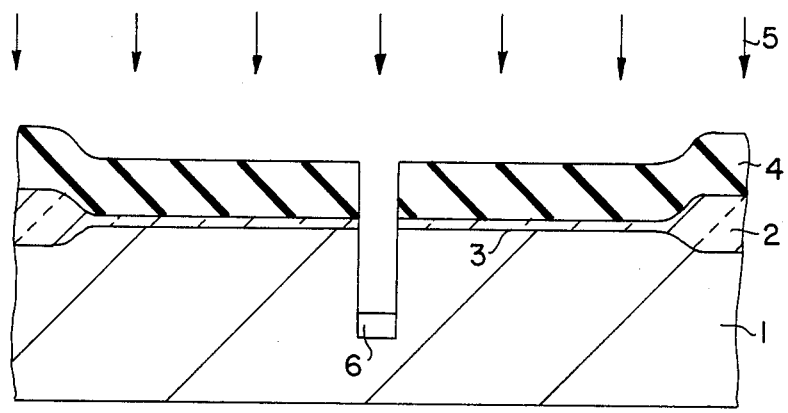
Figure 6:
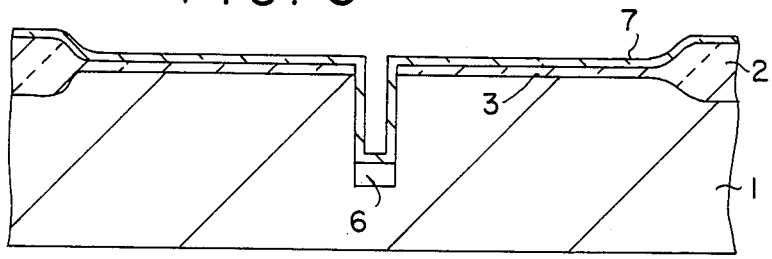
Figure 7:
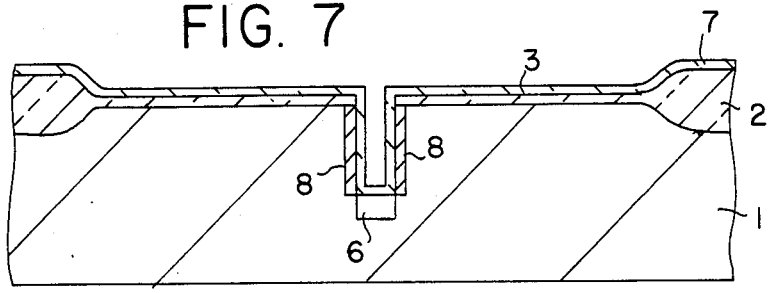
Figure 8:
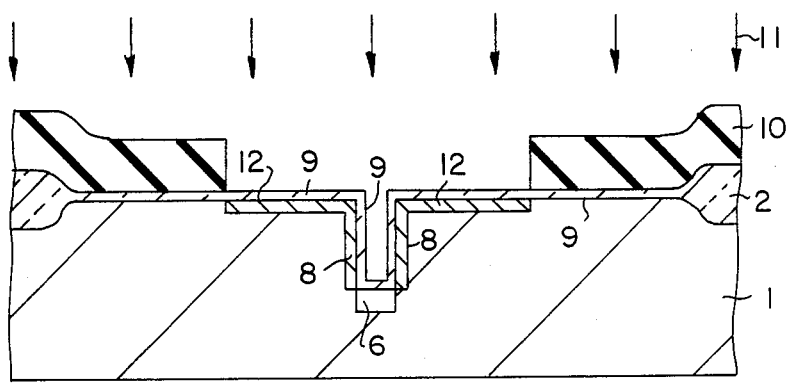
Figure 9:
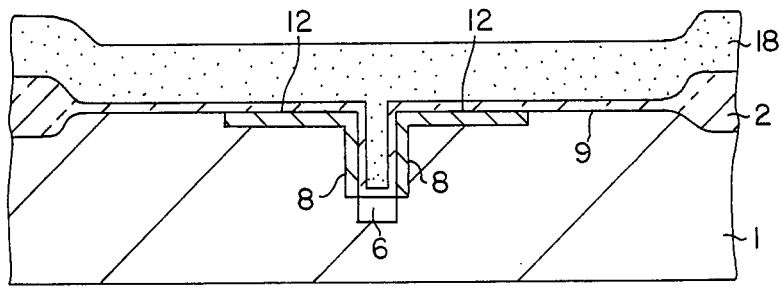
Figure 10:
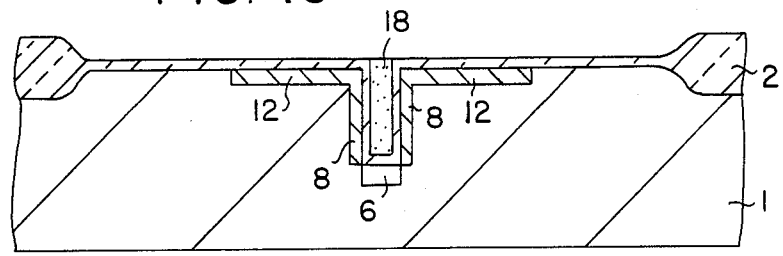
Figure 11:
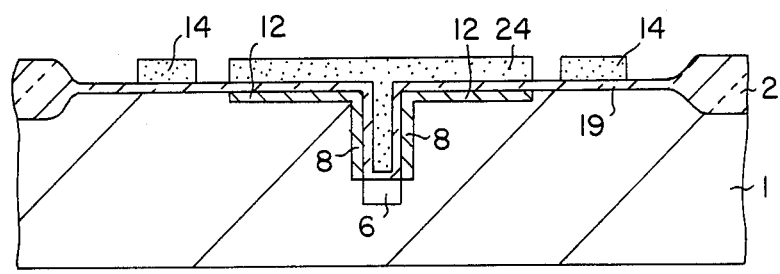
Figure 12:
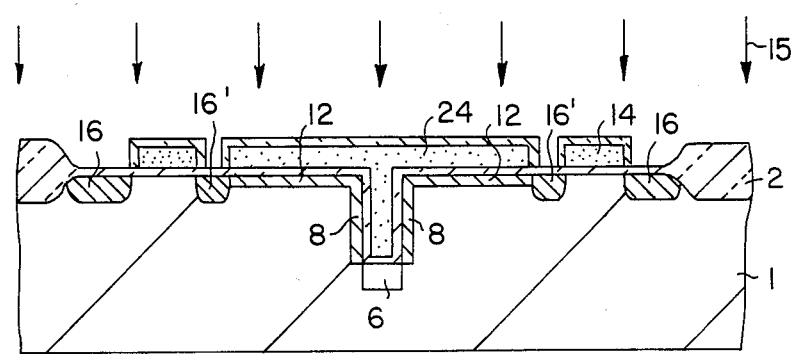

Next, a P-type impurity 5 is ion-implanted by making use of the photo-resist 4 as a mask and thereby a P-type impurity region 6 of 0.8 μm depth and $10^{19}/cm^3$ impurity concentration is formed in the bottom portion of the groove, as shown in FIG. 5. In the case where boron is used as an impurity, energy of 50 to 150 KeV is suitable. Subsequently, as shown in FIG. 6, the photo-resist 4 is removed, and an oxide film 7 doped with an N-type impurity is formed over the entire surface. In the event that phosphorus is employed as an impurity, under the conditions of a forming temperature of 400° to 500° C. and a mixing proportion of $PH_3/S_iH_4$ of a several percents, a phosphorus-doped silicon oxide film 7 of 2000 to 3000 Å in thickness is grown through a vapor-growth process, and then by carrying out diffusion at a temperature of 900° to 1000° C., an N-type impurity region 8 having a surface concentration of about $10^{18}/cm^3$ can be obtained as shown in FIG. 7. Since the surface of the silicon substrate other than the groove portion is covered by the oxide film 3, the N-type impurity is not diffused into the silicon substrate. Next, as shown in FIG. 8, the oxide film 7 doped with the N-type impurity as well as the oxide film 3 are removed by etching, and newly a thermally oxidized silicon film 9 of 150 Å in thickness is formed. This silicon oxide film 9 is used as dielectric films 13 and 23 of a MOS capacitor in the capacitor section. Subsequently, a pattern of a photo-resist 10 is formed, then an N-type impurity 11 is selectively ion-implanted into the surface portion of the silicon substrate to be converted into a capacitor section by making use of the photo-resist pattern 10 as a mask, and thereby N-type impurity layers 12 are formed. In the case where arsenic is used as the impurity, a dose density of ion-implantation of $10^{12}$ to $10^{13}/cm^2$ and energy of about 50 to 150 KeV are suitable. While the N-type impurity is diffused twice into the bottom portion of the groove, in order to maintain sufficient insulation between the memory elements, it is necessary to choose the dose of ion-implantation of the P-type impurity illustrated in FIG. 5 at a value exceeding the dose of ion-implantation of the N-type impurity illustrated in FIG. 8. Next, as shown in FIG. 9, first polycrystalline silicon 18 is deposited over the entire surface, and the interior of the groove is filled with the polycrystalline silicon. In the event that the width of the groove is 1 μm and the depth of the groove is about 4 μm, the thickness of the polycrystalline silicon layer 18 is necessitated to be about 2 μm or thicker. Either the polycrystalline silicon 18 could be preliminarily doped with a conductive impurity or it could be doped with a conductive impurity through a thermal diffusion process after deposition. Then the polycrystalline silicon layer 18 is etched as shown in FIG. 10 through the conventional plasma etching process making use of $CF_4$ series gases, and only the portion within the groove 20 is left. Subsequently, as shown in FIG. 11, second polycrystalline silicon is deposited and a capacitor electrode is formed through a photoetching process. More particularly, a capacitor electrode 24 is formed of the portion of the first polycrystalline silicon layer 18 remaining within the groove and the second polycrystalline silicon layer. Then, thermal oxidation is carried out to deposit a thermally oxidized film onto the capacitor electrode 24 and at the same time increase the thickness of the portion of the silicon oxide film 9 where the capacitor electrode is not formed up to 250 Å, and thereby a gate insulating film 19 of an IGFET is formed. Next, a third polycrystalline silicon layer is deposited and is subjected to patterning, and thereby a gate electrode 14 is formed. In this instance, a part of the edge portion of the gate electrode could be overlapped on the capacitor electrode 24 via the thermally oxidized film on the surface of the capacitor electrode 24. In the next, an N-type region 16 is formed in a self-alignment manner by making use of the field insulating film 2 and the gate electrode 14 as a mask. This region is one of the source and drain regions of the IGFET and it is connected to to a digit line not shown. In addition, in the case where the gate electrode is not overlapped on the capacitor electrode, an N-type region 16' to be connected to the capacitor section is also formed at this moment, as shown in FIG. 12. Then a word line 17 (See FIG. 1) made of aluminium is connected to the respective gate electrodes 14 through contact holes provided in the thermally oxidized silicon film formed on the gate electrodes 14. It is to be noted that the above-described N-type regions 16 and 16' serving as source and drain regions of an IGFET is formed by ion-implanting an N-type impurity at an energy of 50 to 150 KeV and a dose density of $10^{15}$ to $10^{16}/cm^2$.

Figure 13A:
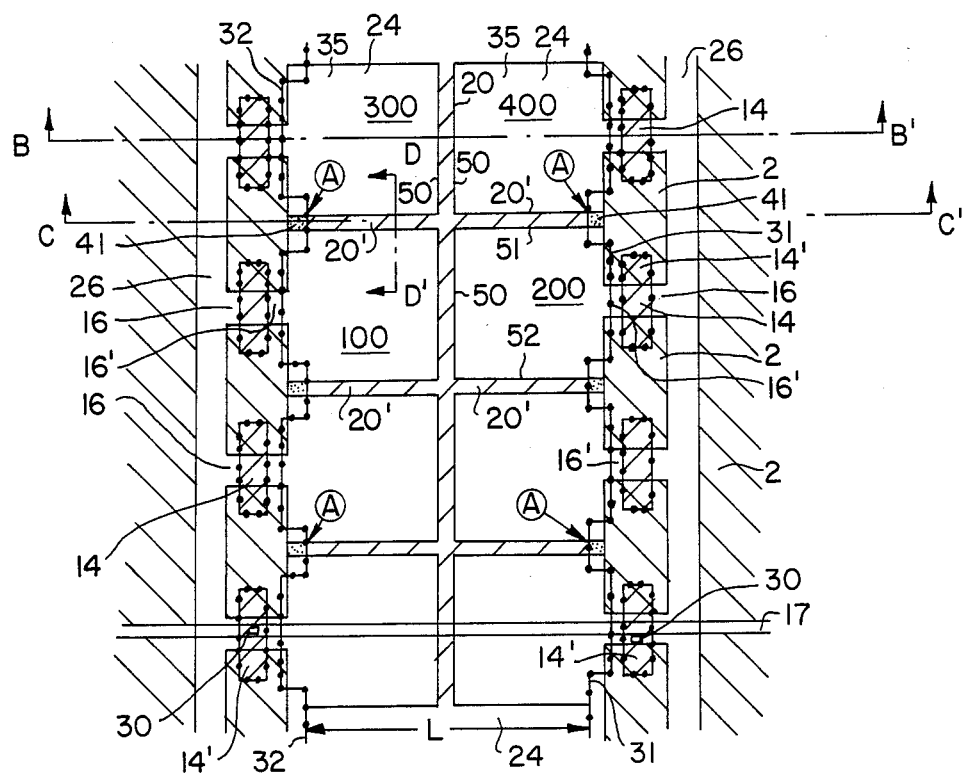
FIG. 13A is a plan view showing a semiconductor memory device in which a plurality of memory cells according to the first preferred embodiment of the invention are arrayed.
Figure 13B:
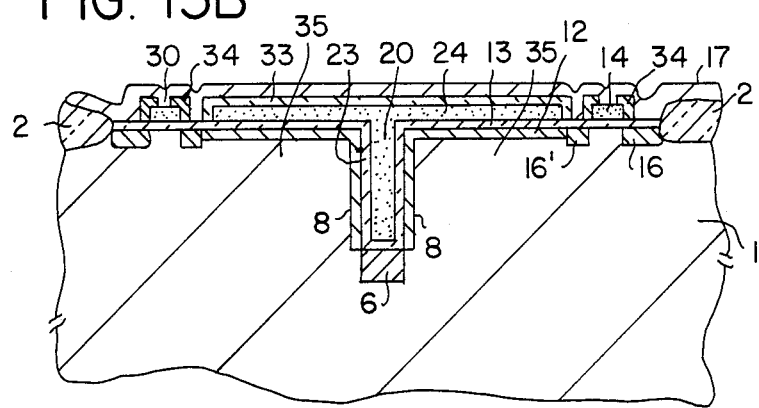
FIGS. 13B, 13C and 13D are cross-sectional views taken along lines B-B', C-C' and D-D', respectively, in FIG. 13A as viewed in the directions of arrows.
Figure 13C:
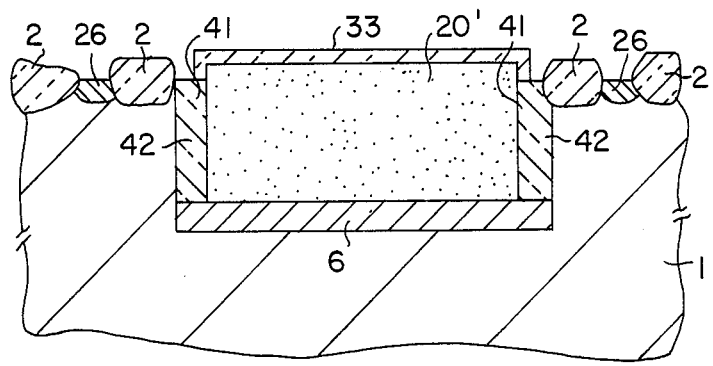
Figure 13D:
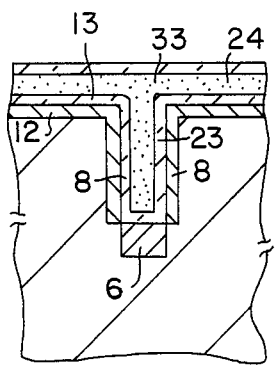

One example of a plan pattern of memory cells according to the present invention is shown in FIG. 13A, and cross-sections of the same pattern of memory cells taken at various locations are shown in FIGS. 13B to 13D. In FIG. 13A, a fish-bone-shaped portion hatched in the right-upward direction is a pattern of grooves 20 and 20', and since three side surfaces of each cell capacitor section 35 are used as a capacitor, the capacitance $C_s$ is greatly increased. In FIG. 13A, portions framed by a black dot chain line (•—•—•—•—•—•) in a rectangular shape and hatched in the right-upward direction are gate electrodes each of which consists of a central part 14 above the channel region and extension parts 14' on the opposite sides (the upper and lower sides as viewed in FIG. 13A) of the central part 14 extending over the field insulating films 2 (hatched in the right-downward direction). A capacitor electrode 24 is provided over the entire area between its left and right edge lines 31 and 32 (represented by black dot chain lines (•—•—•—•—•—•) separated from each other at a distance L (hatching being not applied to avoid complexity of the figure). N-type digit diffused lines 26 extend along the left and right edges of the illustrated pattern of memory cells, the portions between these diffused layers 26 and the channel regions serve one regions 16 of the N-type source and drain regions of the IGFET's, and between the channel regions and the capacitor sections 35 are provided the other regions 16' of the N-type source and drain regions. These other regions 16' can be omitted if the structure in which the gate electrode 14 and the capacitor electrode 24 are overlapped with each other via an insulating film is employed. Or else, the digit lines could be formed of wiring layers of aluminium or polycrystalline silicon and connected to the regions 16. In addition, word lines 17 made of aluminium and forming an upper layer extend above the capacitor upper electrode 24 via an insulating film 33 at right angles to the digit lines 26, and they are connected to the gate electrodes 14 through contact holes 30 provided in the insulating film 34 (see FIG. 13B). While this contact hole 30 is provided above the channel region, as a matter of course, it could be provided at a portion above the field insulating film 2. It is to be noted that although only one word line is illustrated in FIG. 13A to avoid complexity of the figure, as a matter of course, a plurality of word lines are provided in parallel to the illustrated one and they are connected to the respective gate electrodes through contact holes.

Since the capacitor section 35 in the memory device according to the present invention makes use of side wall surfaces 50, 51 and 52 of the grooves 20 and 20' surrounding each plane surface of the capacitor section 35 as shown in FIG. 13A, a sufficiently large capacitance value can be obtained. The insulation between laterally juxtaposed memory cells as viewed in FIG. 13A, that is, the insulation between the memory cells 300 and 400 or the insulation between the memory cells 100 and 200 does not become an issue because a high-concentration P-type region 6 is provided at the bottom of each groove 20 as described previously. On the other hand, the insulation between longitudinally juxtaposed memory cells as viewed in FIG. 13A, that is, the insulation between the memory cells 100 and 300 or the insulation between the memory cells 200 and 400, in other words, the insulation across the portion indicated by Ⓐ in the following manner.

That is, after the upper electrode 24 for the capacitor has been formed, the polycrystalline silicon above and in the opposite end portions 41 of the groove 20', are removed and further the N-type impurity regions 8 along the opposite side wall surfaces of that portion 41 are also removed. Subsequently, these removed portions are filled with insulator material such as silicon oxide films 42 (FIG. 13C). This can be achieved, for example, by depositing a silicon oxide film over the surface of the substrate through a vapor-growth process, then removing the portion of the silicon oxide film on the surface of the substrate through a reactive ion etching process and leaving the silicon oxide film only in the interior of the groove. Thereby the insulation between the memory cells aligned in the longitudinal directions as viewed in FIG. 13A becomes excellent.

Figure 14:
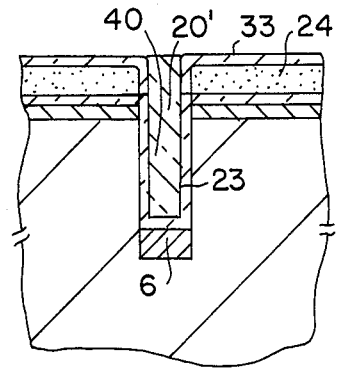
FIG. 14 is a cross-sectional view showing a second preferred embodiment of the present invention in which the first preferred embodiment is partly modified.

Furthermore, as a second preferred embodiment of the present invention, the groove 20' could be filled with a silicon oxide film 40 over the entire length in the lateral direction as viewed in FIG. 13A through the above-mentioned process as shown in FIG. 14 corresponding FIG. 13D. In this modified case, in each memory cell only the dielectric films on the side wall surface 50 of the groove 20 and on the top surface of the substrate in the capacitor section 35 are used as a capacitor, and the side wall surfaces 51 and 52 of the two upper and lower grooves 20' as viewed in FIG. 13A are not utilized as a capacitor. Therefore, the structure illustrated in FIG. 14 is applicable only in the case where a surplus is present in the capacitance. In this case, as a matter of course, the respective upper electrodes 24 of the capacitors are electrically connected with each other through a known method.

Figure 15A:
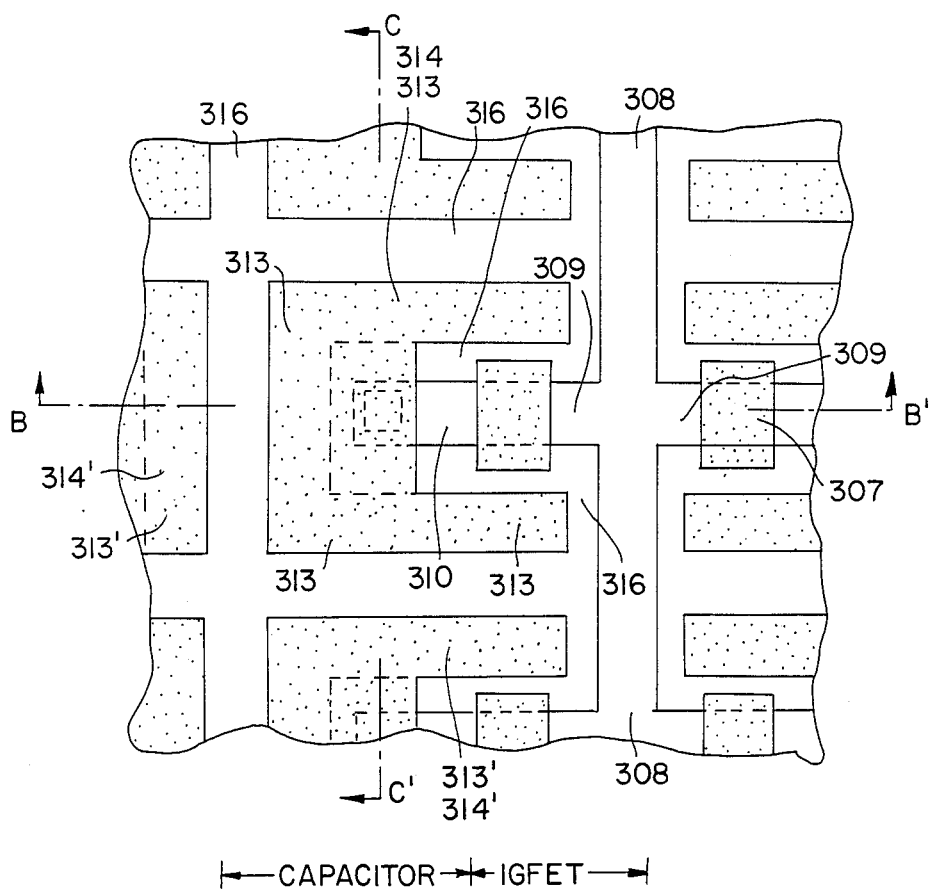
FIG. 15A is a plan view showing a third preferred embodiment of the present invention.
Figure 15B:
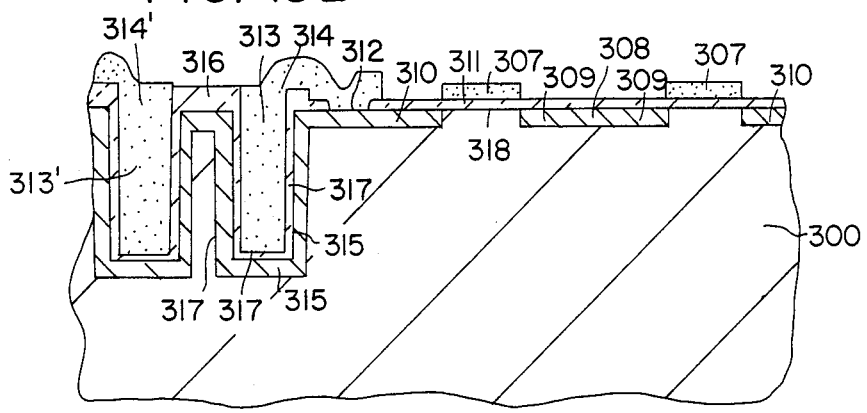
FIGS. 15B and 15C are cross-sectional views taken along lines B-B' and C-C', respectively, in FIG. 15A as viewed in the direction of arrows.
Figure 15C:
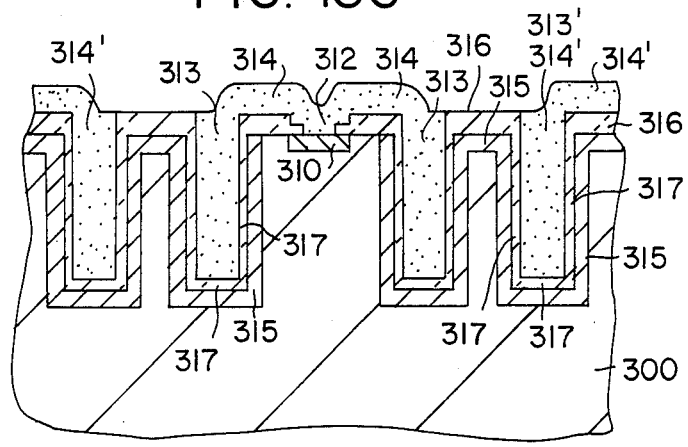

Referring now to FIGS. 15A to 15C which show a third preferred embodiment of the present invention, a plurality of memory cells are connected to opposite sides of an N-type digit line 308 provided along one major surface of a P-type semiconductor substrate and extending in one direction. Each memory cell comprises an IGFET including an N-type region 309 continuously connected to the digit line 308 and serving as one of source and drain regions, another N-type region 310 serving as the other region, a channel region 318 between the source and drain regions, a gate insulating film 311 above the channel region 318, and a silicon gate electrode 307 on the gate insulating film 311. Furthermore, in each memory cell, an upper capacitor electrode 314 made of polycrystalline silicon is connected to the above-described N-type region 310 through a contact hole 312 provided in the insulating film 311. A capacitor section of each memory cell is formed within a groove having a U-shaped plan configuration and formed around the outer periphery of each memory cell forming region. More particularly, a groove 313 of 2 to 4 μm in depth is formed in the semiconductor substrate penetrating through an insulating film 316 that is thicker than the gate insulating film 311. The plan configuration of this groove 313 is a U-shape surrounding the source and drain regions 310 and 309, the channel region 318 and the gate electrode 307 as shown in FIG. 15A. The width of the groove 313 is 1 μm, and on the inner wall surface of the groove 313 is deposited an insulating film 317 of 500 Å in thickness such as, for example, a silicon oxide film or a silicon nitride film to serve as a dielectric film of a capacitor. In addition, in the portion of the semiconductor substrate along the outer periphery of the groove 313 is provided a P+-type region 315 having a higher impurity concentration than the semiconductor substrate. Accordingly, the capacitor in each memory cell is a MOS capacitor consisting of the upper capacitor electrode 314 of polycrystalline silicon filled in the groove 313, the dielectric film 317 and the P+-type region 315 in the P-type semiconductor substrate.

On the other hand, the interval between the upper capacitor electrode 314 in the groove 313 of one memory cell and the corresponding electrode 314' in the groove 313' of adjacent memory cell is chosen to be 1 μm. At this interval, the insulation between the adjacent memory cells can be maintained satisfactorily by means of the relatively thick insulating film 316 made of silicon oxide or the like and the P+-type region 315 thereunder. Also, similarly to the above-described first preferred embodiment, the digit line could be formed by making use of a wiring layer of aluminium, polycrystalline silicon or the like instead of being formed of a diffused layer as shown in FIGS. 15A and 15B, and the wiring layer could be extended on an insulating film and connected to the respective N-type regions 309 through contact holes provided in that insulator film. Furthermore, a word line is extended on an insulating film through a well-known method and is connected to the respective gate electrode 307 through contact holes provided in the insulating film. With this preferred embodiment also, memory cells having a capacitance of 50 fF or larger can be realized without sacrificing a high degree of circuit integration similarly to the first preferred embodiment. In addition, since only a MOS capacitor is utilized, a resistivity against α-rays is also large, and there is no need to consider elongation of a depletion layer.

Figure 16:
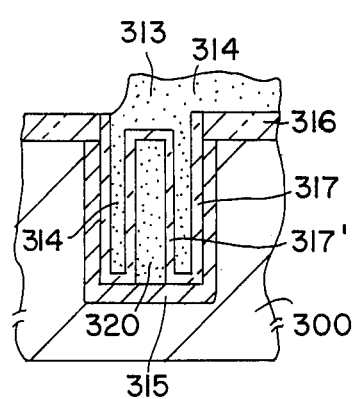
FIGS. 16 and 17 are cross-sectional views showing fourth and fifth preferred embodiments, respectively, of the present invention in which the third preferred embodiment is partly modified.

A fourth preferred embodiment of the present invention shown in FIG. 16 is a modification of the third preferred embodiment shown in FIGS. 15A to 15C. According to this modification, within the groove 313 is erected a polycrystalline silicon plate 320 containing a P-type impurity as connected to the P+-type region 315 in the semiconductor substrate, then a dielectric coating film 317' is deposited on the surface of the silicon plate 320 as the film 317 on the inner wall surface of the groove 313, and an upper capacitor electrode 314 is filled in the groove. If such modification is made, the area of the capacitor dielectric film is further enlarged, and so, a still larger capacitance xan be obtained. In order to form such a polycrystalline silicon plate 320, it is only necessary that a layer of silicon dioxide or the like is formed up to a predetermined thickness on the inner side wall surface and the bottom surface of the groove 313 through a vapor-growth process or the like, then the silicon dioxide layer on the bottom surface is removed through an anisotropic dry etching process, thereafter polycrystalline silicon is filled in the space between the silicon dioxide layers on the opposite side wall surfaces, and subsequently, the silicon dioxide layers are removed through a chemical etching process. Moreover, if a narrow groove or grooves are formed in the polycrystalline silicon plate 320 through a reactive etching process, then the area of the capacitor dielectric film can be further enlarged.

Figure 17:
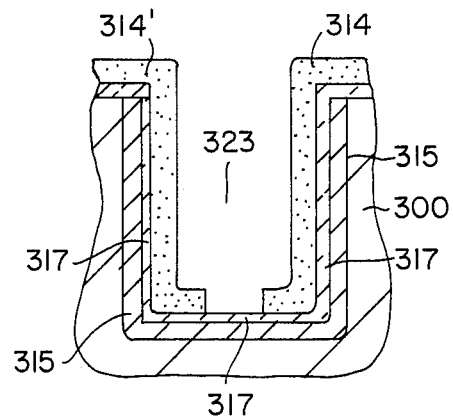

In a fifth preferred embodiment of the present invention shown in FIG. 17, the feature of the first preferred embodiment is incorporated in the third preferred embodiment shown in FIGS. 15A to 15C. In more particular, a groove 323 having a larger width than the groove 313 in FIGS. 15A to 15C has been preliminarily formed, an upper capacitor electrode 314 in one memory cell and an upper capacitor electrode 314' in the adjacent memory cell are extended onto the opposite side wall surfaces of the same groove 323, and they are insulated from each other as spaced by a distance of about 1 μm on the bottom surface of the groove 323. If an insulator is filled in this groove through a well-known method, then the insulation between the respective memory cells can be maintained satisfactorily. If such modification is made to the third preferred embodiment shown in FIGS. 15A to 15C, though the capacitance is decreased as compared to that of the capacitor shown in FIGS. 15A to 15C, a degree of circuit integration can be improved. In FIGS. 16 and 17, component parts having the same functions as those shown in FIGS. 15A to 15C are given like reference numerals. Hence, the groove 323 according to the modified embodiment shown in FIG. 17 could be replaced for the groove 313 in FIGS. 15A to 15C, and the capacitors in the adjacent memory cells could be formed on the opposite side wall surfaces of the same groove 323.

What is claimed is:

1. A semiconductor memory device having a memory cell comprising a single insulated gate type field effect transistor and a single capacitor, said device including a semiconductor substrate of one conductivity type and having a major surface, a groove partially surrounding an area of said major surface of said substrate and extending from said major surface of said substrate towards the interior of said substrate, said groove having a bottom, a first side wall surface extending from said area of said major surface to said bottom, and a second side wall surface opposite said first side wall surface, an source or drain region of said transistor having the opposite conductivity type and formed in said major surface of said substrate, a first surface layer of said opposite conductivity type formed in said area of said major surface of said substrate and coupled to said transistor through the unsurrounded part of said area, said first surface layer having a depth less than the depth of said source or drain region of said transistor, a second surface layer of said opposite conductivity type formed along said first side wall surface of said groove and connected to said first surface layer, a first dielectric film formed on said area of said major surface, a second dielectric film formed on said first side wall surface of said groove, and a conductor layer formed on said first dielectric film above said major surface and on said second dielectric film within said groove, whereby said single capacitor of said memory cell includes a first MOS type capacitor comprising said first surface layer, said first dielectric film and said conductor layer, and a secnd MOS type capacitor comprising said second surface layer, said second dielectric film and said conductor.

2. A semiconductor memory device as claimed in claim 1, further including a third dielectric film on said second side wall surface of said groove to form a MOS type capacitor of an adjacent memory cell.

3. A semiconductor memory device as claimed in claim 1 wherein first and second PN junction capacitors are formed between said first surface layer and said substrate, and between said second surface layer and said substrate, respectively.

4. A semiconductor memory device as claimed in claim 1, in which one of the source and drain regions of said transistor is connected to a digit line.

5. A semiconductor memory device as claimed in claim 1, in which an impurity region of the same conductivity type as said semiconductor substrate and having a higher impurity concentration than said semiconductor substrate, is provided in the portion of said semiconductor substrate under said bottom surface of said groove.

6. A semiconductor memory device as claimed in claim 5, said impurity region has a depth of 0.5 to 1.0 $\mu$m from said bottom of said groove and an impurity concentration of $5 \times 10^{18}/cm^3$ or higher, and the insulating film on said bottom surface of said groove has a thickness of 100 Å or larger.

7. A semiconductor memory device comprising a semiconductor substrate of one conductivity type and having a flat major surface, first and second digit lines extending in one direction in the plan view, a first groove provided from said major surface of said substrate towards the interior of said substrate and extending in said one direction substantially along a midline between said first and second digit lines, a plurality of second grooves each provided from said major surface of said substrate towards the interior of said substrate and extending substantially at right angles to said first groove in the plan view, a plurality of surface portions of said major surface, each of said surface positions being surrounded by said first and second grooves except one side thereof, a thick field insulating film selectively formed on said substrate and at least partially embedded in said substrate such that the depth of said thick field insulating film from said flat major surface is less than that of said first and second grooves, said thick field insulating film having a plan configuration making contact with an end of each second groove, a first thin insulating film provided on the opposite side wall surfaces and the bottom surfaces of the respective ones of said first and second grooves, an impurity region of said one conductivity type and having a higher impurity concentration than said substrate provided in the portion of said substrate under said bottom surfaces of said first and second grooves, a second thin insulating film provided on each of said surface portions of said major surface, first inversion layers of the opposite conductivity type formed in said opposite side wall surfaces of at least said first groove, second inversion layers of the opposite conductivity type formed in each of said surface portions of said major surface and connected to respective said first inversion layers, a conductive layer provided on said first and second thin insulating films, insulator materials filled in respective end parts of said second grooves in proximity with the respective ends connected with said thick field insulating film, and a plurality of insulated gate type field effect transistors provided on said substrate, each of said transistors being coupled to one of said first and second bit lines and to corresponding said second inversion layer in said surface portion of said major surface, each transistor including source, drain region of the opposite conductivity type having a depth greater than that of said second inversion layer, whereby a plurality of memory cells each including one of said transistors and one capacitor coupled to said transistor are formed on said substrate, said one capacitor having a first MOS type capacitor constituted by said first inversion layer, said first insulating film and said conductive layer, and a second MOS type capacitor constituted by said second inversion layer, said second insulating film and said conductive layer.

8. A semiconductor memory device as claimed in claim 7, in which a part of PN junction capacitor in said capacitor of said memory cell is constructed of said first inversion layer of said opposite conductivity type and said semiconductor substrate in said first groove.

9. A semiconductor memory device as claimed in claim 7, in which said second grooves are entirely filled with an insulator material.

10. A semiconductor memory device as claimed in claim 7, wherein parts of said second grooves other than said end parts are filled with said conductor layer to form said first MOS type capacitor.

11. A semiconductor memory device comprising a semiconductor substrate of one conductivity type, an insulated gate type field effect transistor provided in a transistor forming area of said semiconductor substrate and having one of source and drain regions of the opposite conductivity type connected to a digit line, the other of source and drain regions of said opposite conductivity type, a channel region between said source and drain regions and a gate electrode formed on said channel region via a gate insulating film, a groove formed in said semiconductor substrate and having U shape in the plan view such that it surrounds said transistor forming area, a dielectric film formed on the both inner side wall surfaces facing each other and on the bottom surface of said groove, an impurity region of said one conductivity type having a higher impurity concentration than that of said semiconductor substrate formed in portions of said semiconductor substrate said inner side wall surfaces and the bottom surface of said groove, and a conductor layer formed on said dielectric film within said groove and connected to said the other of source and drain of said transistor, wherein said conductor layer is absent on a portion of said bottom surface of said groove, and wherein a part of said conductor layer extending on one of said inner side wall surfaces of said groove via said dielectric film serves as an upper electrode of a capacitor in a first memory cell and a part of said conductor layer extending on the other of said inner side wall surfaces of said groove via said dielectric film serves as an upper electrode of a capacitor in a second memory cell adjacent to said first memory cell, whereby a MOS capacitor of said memory cell connected to said transistor is constructed by said conductor layer connected to said other of source and drain and provided within said groove, said dielectric film and said impurity region of the same conductivity type as said substrate.

* * * * *